United States Patent [19]

Landry et al.

[11] Patent Number: 5,446,622
[45] Date of Patent: Aug. 29, 1995

[54] PC BOARD CARTRIDGE FOR A COMPUTER TERMINAL

[75] Inventors: Christian C. Landry, Harvard, Mass.; Tzong-Bin Tsai, Taipei, Taiwan; Bradford G. Chapin, Nashua, N.H.; Jin-Bond Lou, Taoyuan, Taiwan

[73] Assignee: Digital Equuipment Corporation, Maynard, Mass.

[21] Appl. No.: 103,510

[22] Filed: Aug. 6, 1993

[51] Int. Cl.6 ............................................. H05K 1/04
[52] U.S. Cl. .................................. 361/737; 361/684; 361/752; 439/79
[58] Field of Search .................... 211/41; 439/59, 62, 439/64, 76, 78, 79; 312/331.2, 333; 361/608, 610, 622, 684, 724–728, 736, 737, 740–742, 747, 752, 754, 758, 759, 807, 809; 364/708.1

[56] References Cited

U.S. PATENT DOCUMENTS

| | | | |
|---|---|---|---|
| 3,737,729 | 6/1973 | Carney | 361/740 |
| 4,119,818 | 10/1978 | Nochese | 200/500 AA |
| 4,226,491 | 10/1980 | Kazama | 439/76 |
| 4,409,641 | 10/1983 | Jakob | 361/752 |
| 4,821,145 | 4/1989 | Corfits | 361/383 |
| 4,821,146 | 4/1989 | Behrens | 361/383 |
| 5,111,362 | 5/1992 | Flamm | 361/736 |
| 5,268,820 | 12/1993 | Tseng | 361/785 |

*Primary Examiner*—Gerald p. Tolin
*Attorney, Agent, or Firm*—Albert P. Cefalo; Ronald C. Hudgens; Mary M. Steubing

[57] ABSTRACT

A PC board cartridge for a computer terminal, the cartridge including a casing for holding a PC board with a connector mounted thereon. A handle is pivotally mounted on the casing along an axis extending in a plane that extends perpendicular to a major surface of the board and intersects the board at the connector. The PC board cartridge preserves electrical and mechanical connector integrity by providing a handle for removal which applies generally equal forces across the connector during removal. In addition, no additional hardware is required for assembly, installation, or removal of the cartridge.

10 Claims, 6 Drawing Sheets

PC BOARD CARTRIDGE FOR A COMPUTER TERMINAL

BACKGROUND OF THE INVENTION

The invention relates to computer terminals, and particularly to PC board cartridges for computer terminals.

Today's smarter computer terminals sometimes support optional features requiring a user-installed expanded memory option. One way of supporting such an option is by providing a PC board cartridge. The cartridge is an assembly including a PC board containing the memory which the user plugs into the terminal. Since the option is user installed, safety and ease of installation are important considerations in cartridge design as is maintaining the integrity of the memory connection to the terminal.

In the past, such user-installed memory options have been provided for terminals such as the VT340 from Digital Equipment Corporation. The VT340 memory cartridge included a molded plastic enclosure for holding a PC board including a ROM chip. The PC board included a vertical male edge connector to be received by a vertical female edge connector upon installation into the terminal. The cartridge included a handle for removal, the handle being an elongated member hinged at a single point at the top of the cartridge. The user removed the cartridge by rotating the handle outward from the terminal and pulling until the mating connector pairs disengaged.

This particular cartridge design had a number of problems. First of all, the only means of securing the cartridge to the terminal was the frictional contact of the connector itself, resulting in undesirable stresses on the connector. Secondly, the mating pairs of an assembled connector should be disconnected using a force substantially parallel to the connector pins in order to preserve connector integrity. However, the removal point of action of the handle for the VT340 cartridge acted at the top edge of the connector, causing the connector to rotate as it disconnected. There is a need for an improved user installed PC board cartridge which maintains connector integrity while providing ease of installation and removal for the user.

SUMMARY OF THE INVENTION

In accordance with the present invention, there is provided a PC board cartridge for a computer terminal. The cartridge includes a PC board having two parallel major surfaces. A connector resides on one major surface of the PC board. Also included is a casing carrying the PC board and connector, the casing having an opening at the mating side of the connector. A handle is pivotally mounted on the casing along an axis extending in a plane that extends perpendicular to a major surface of the board and intersects the board at the connector.

According to a more specific aspect of the invention, there is provided a PC board cartridge for a computer terminal including a casing and a PC board. The casing is open on one side and includes a back wall having an inner surface with standoffs extending normally from the inner surface. The standoffs have an end region and a base region wider than the end region. The casing also has end walls extending normally from the inner surface of the back wall. One of the end walls has a greater width than the other end wall with the wider of the two end walls having a slot therein. The casing further includes two elongated sidewalls extending normally from the inner surface of the back wall. The sidewalls have inner surfaces with one end region of each sidewall being of the width of the wider end wall. Each sidewall has a line of snap tabs on its inner surface along its length. The PC board is mounted in the casing and has a connector mounted thereon. The PC board has a tab extending through the slot and has holes through which the outer regions of the standoffs extend. The board rests on the wider regions of the standoffs and is held in place along the sidewalls by the snap tabs. The connector is positioned on the board such that it lies between the wider ends of the sidewalls.

According to a more specific aspect of the invention, the sidewalls of the cartridge include exterior indentations on their taller ends near the back wall, and a handle includes projections at one end on either side. The projections include protrusions on their facing surfaces for engaging the indentations in the sidewalls to hold the handle in place.

The PC board cartridge described herein preserves electrical and mechanical connector integrity by providing a handle for removal which applies generally equal forces across the connector during removal. In addition, no additional hardware is required for assembly, installation, or removal of the cartridge.

DETAILED DESCRIPTION OF THE PREFERRED EMBODIMENT

Figure 1:
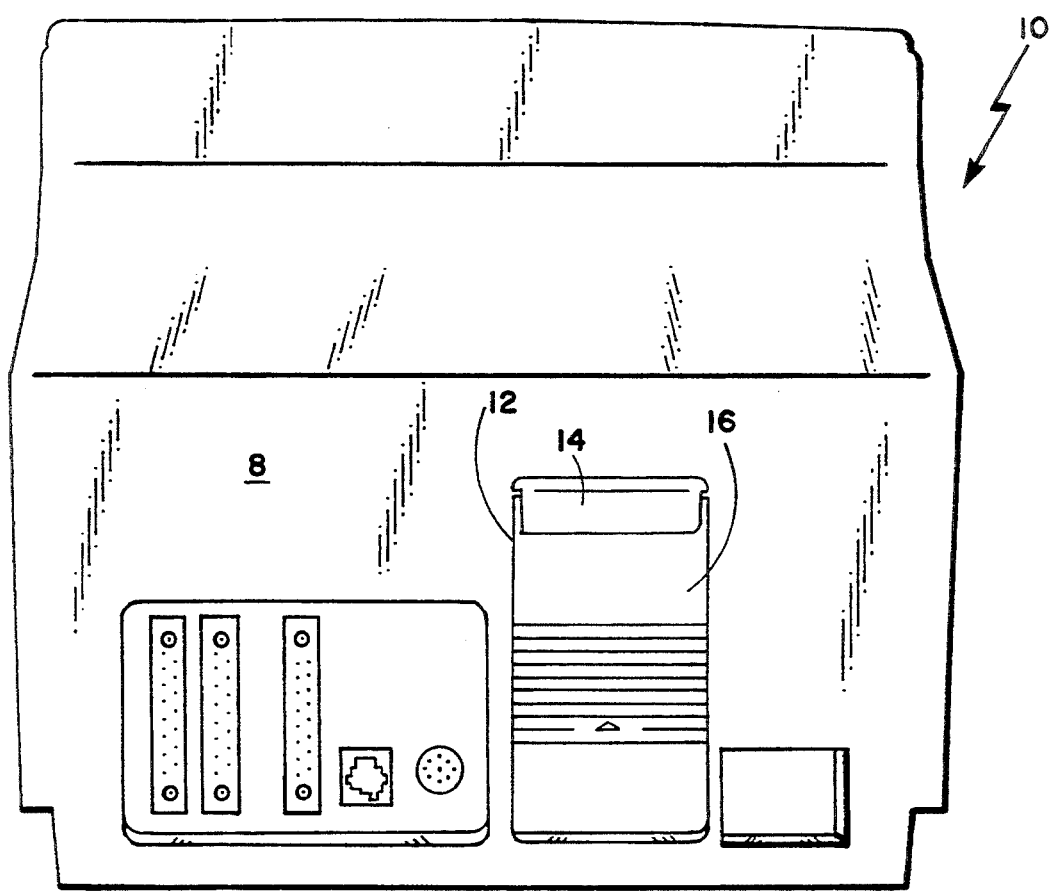
FIG. 1 is a rear elevation view of a computer terminal in which a PC board cartridge according to the principles of the invention is installed.

FIG. 1 shows the rear wall 8 of a computer terminal 10 into which a PC board cartridge 12 is installed. The cartridge 12 includes a casing 14 and a handle 16.

Figure 2:
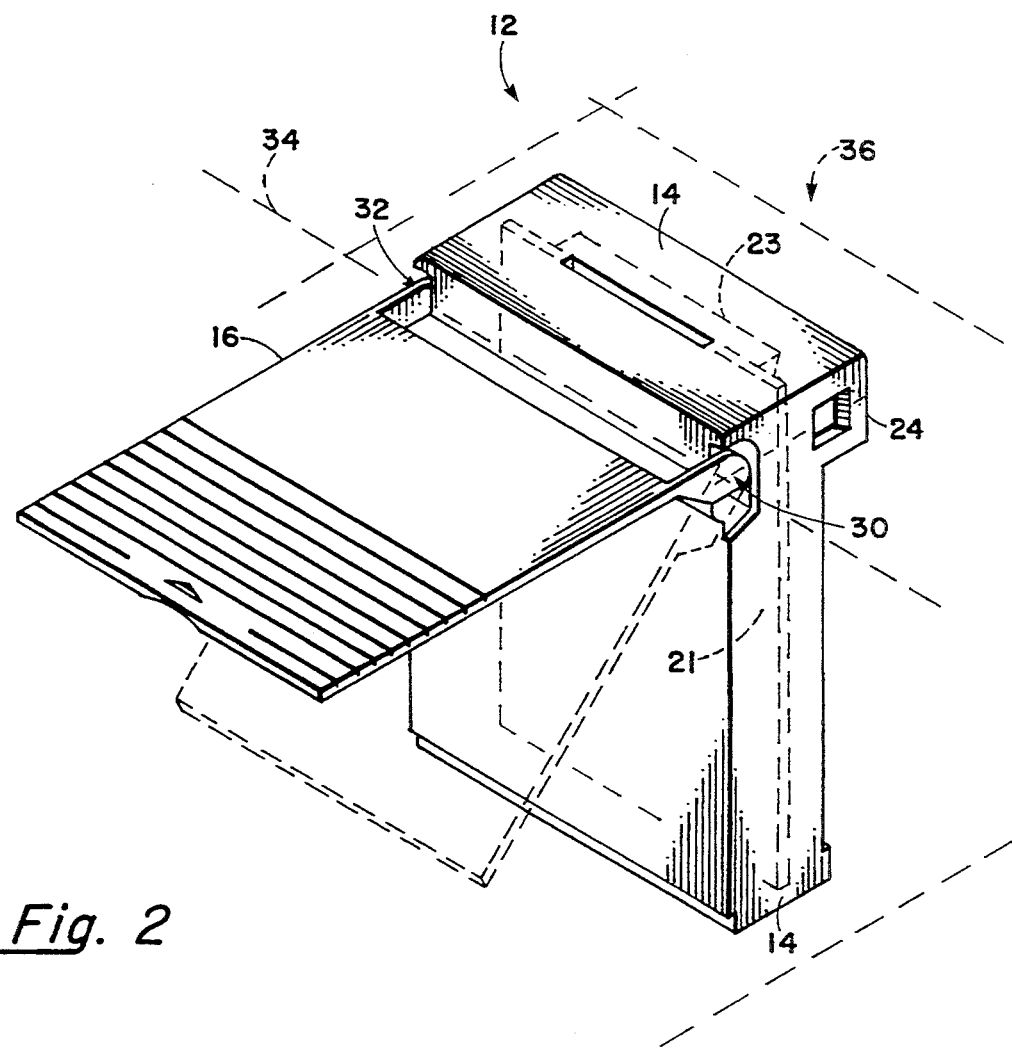
FIG. 2 is a perspective view of the PC board cartridge of FIG. 1.
Figure 3:
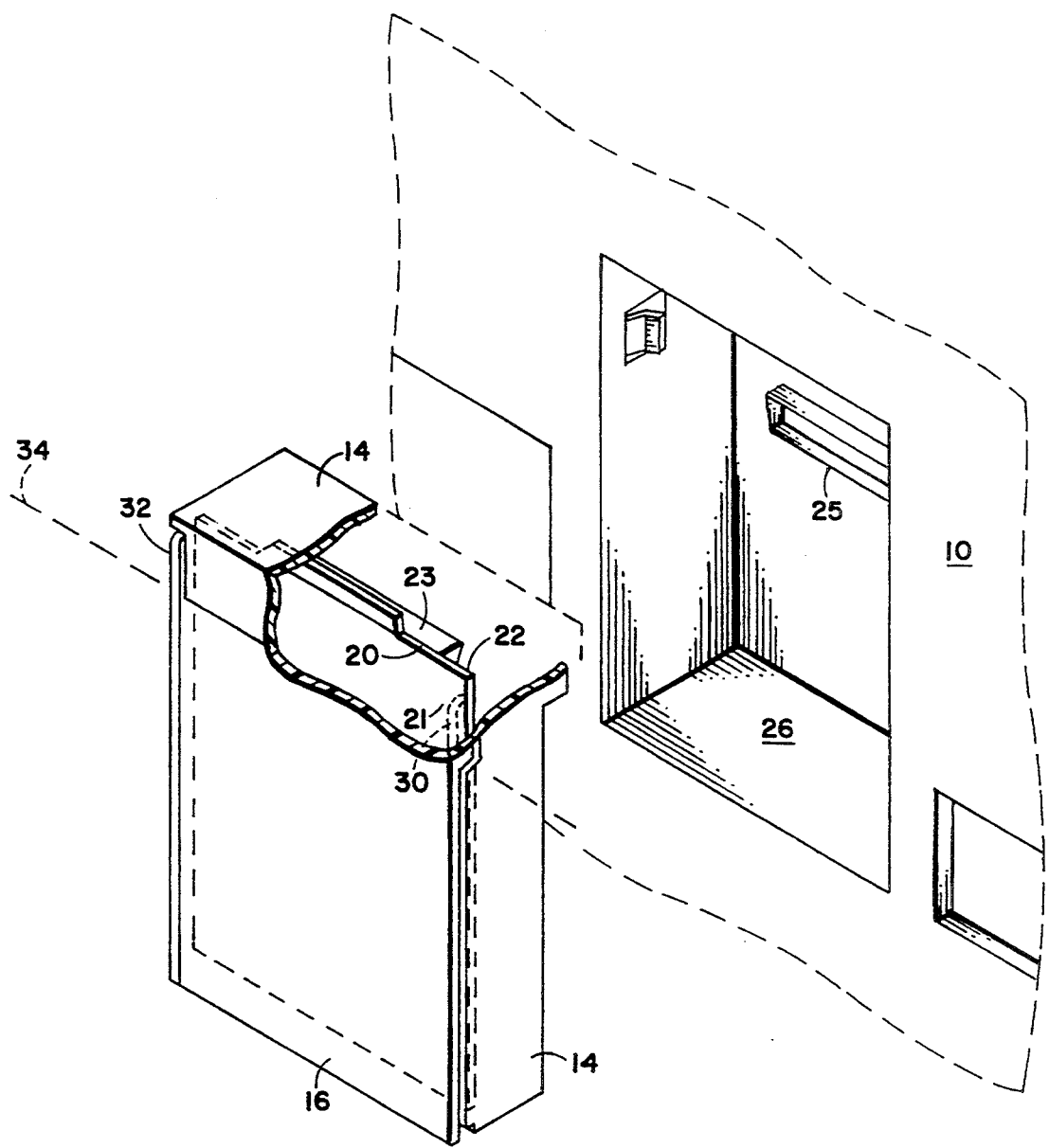
FIG. 3 is a cutaway perspective view of the PC board cartridge.
Figure 4:
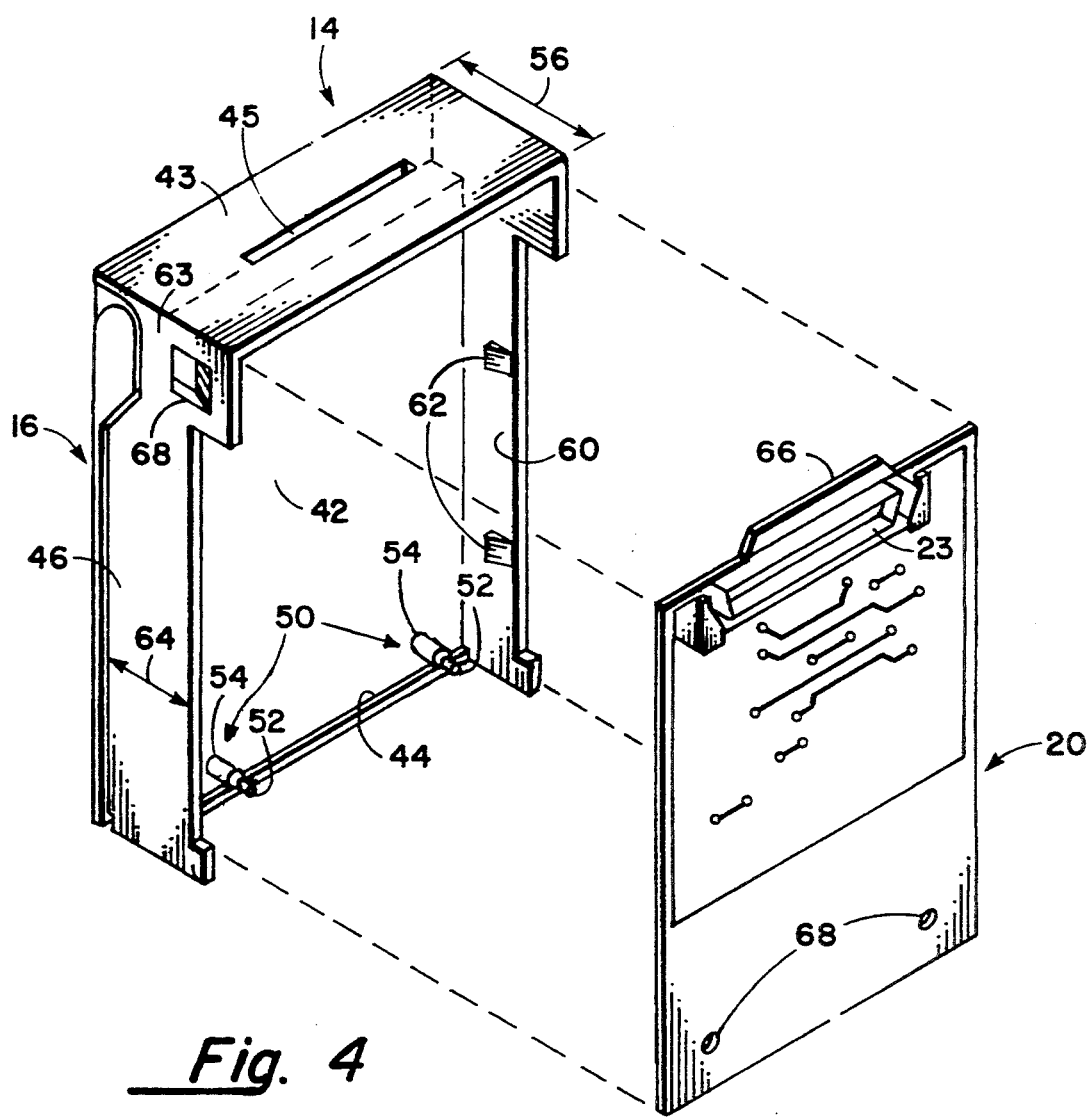
FIG. 4 is a perspective view of a PC board and cartridge assembly according to the principles of the invention.

Referring to FIGS. 2, 3, and 4, there is shown the cartridge 12 in further detail. A PC board 20 having two parallel major surfaces 21 and 22 is installed within the casing 14. The PC board 20 includes on its major surface 22 a connector 23, the mating side of which is accessible through an opening 24 in the casing 14. When installed in the terminal 10, the connector 23 engages a mating connector 25 within a recess 26 in the rear of the terminal 10. Here, the connectors 23 and 25 are shown to be of the D-subminiature type, but may generally be of various other available types such as edge connector, pin connector, right angle connector, latch connector etc. The PC board 20 further includes for example a memory chip such as a ROM (not shown), that may store, for instance, language fonts for optional use by a user.

In order to remove the cartridge 12 from the terminal 10, the handle 16 is pivoted outward until it is generally perpendicular to the major surfaces 21 and 22 of the PC board 20 as shown. The handle is then pulled directly outward, releasing the cartridge from the terminal 10.

As shown, the handle 16 is pivotally mounted on the casing 14 at two locations 30 and 32. Here, the handle 16 is shown to be pivotally mounted on an axis 34 which lies in a plane 36 extending perpendicular to the major surfaces 21 and 22 of the PC board 20 and which bisects the connector 23. Thus, the handle 16 is effective to provide even forces across the connector 23 upon removal of the cartridge 12 from the terminal 10.

In general, according to the invention the handle 16 is pivotally mounted on the casing 14 along an axis 34 extending in a plane 36 that is perpendicular to the major surfaces 21 and 22 of the PC board 20 and intersects the board 20 at the connector 23, preferably intersecting the connector 23. That is, the pivoting axis 34 should pass close enough to, or intersect with, the connector 23 to provide substantially equal forces across the connector 23 when a user uses the handle 16 to pull the cartridge 12 from the terminal. The electrical and mechanical integrity of the connector 23 is thereby protected from the effects of twisting and bending upon removal.

In FIG. 2, the plane is shown in its preferred disposition, bisecting the connector 23. In the embodiment shown in FIGS. 2, 3, and 4, the axis 34 is spaced from the side 22 of the PC board 20 opposite the side 21 with the connector 23 at a distance of approximately 7.70 mm. The pivotal mounting points 30 and 32 may be effectively located at other positions; for example, the plane 36 may intersect the connector 23 at a position other than the center of the connector 23, or the plane 36 may be slightly spaced from the connector 23. In addition, The axis 34 may be spaced from the connector 23 in the plane 36 such that the axis 34 lies forward of, at, or to the rear of the connector 23.

Also, in FIGS. 2, 3, and 4, the connector is shown to be elongated with its elongated sides lying horizontally. The axis of the pivotal mounting points 30 and 32 is thus also horizontal as shown in the Figures. It is possible to provide different configurations; for example, a vertically elongated connector may be used with a handle whose axis between pivotal mounting points is also vertical and at the connector. Also, a circular connector might be used with a handle whose axis between pivotal mounting points is at the connector and lying in any direction. Further, the handle 16 might be mounted at one location, for example on a hinge, or might be mounted at more than two locations.

Referring now to FIG. 4, there is shown the assembly of the cartridge casing 14 and the PC board 20. The casing 14 is open on one side and includes a back wall 42, end walls 43 and 44, and elongated sidewalls 46. The back wall 42 has two spaced apart standoffs 50 extending normally from its inner surface 28. Each standoff 50 has an end region 52 and an wider base region 54. The end wall 43 has a width 56 greater than the width 58 of the end wall 44. The end wall 43 also includes a slot 45 extending widthwise of the casing 14. Also, the sidewalls 46 each have inner surfaces 60 that each have a line of snap tabs 62 along their length. Each sidewall 46 has a wider region 63 at one end. As shown, the wider region 63 is of the same width as the end wall 43. In the embodiment shown, the sidewalls 46 have a width 64 of approximately 12.28 mm, while their wider regions 63 and the end wall 43 have a width 56 of approximately 22.05 mm. Other dimensions may be suitable in different applications.

The PC board 20 includes a wide tab 66 that fits into the slot 45 in the end wall 43 to aid in mounting the PC board 20 in the casing 14. The PC board 20 also includes holes 68 through which the end regions 52 of the standoffs 50 extend. The board rests on the base regions 54 of the standoffs 50 and is held in place along its length by the snap tabs 62. The board 20 thus requires no hardware, such as screws, nuts, or bolts, for retention within the casing 14. The connector 23 is positioned on the board 20 such that it lies in the casing 14 in the space between the wider regions 63 of the sidewalls 46.

FIG. 4 shows the installation of the cartridge 12 into the recess 26 in the rear of the terminal 10. The casing 14 has on the exterior surface of the wider region 63 of each of the sidewalls 46 a detent 68, here shown for example as a rectangular shaped detent. On each of the sides 72 and 74 of the recess 26 there is located a fingertab 76 for cooperation with the detents 68. Here, the fingertabs 76 are shown for example to be of a rectangular shape, corresponding to the shape of the detents 68. When the cartridge 12 is pushed into the recess 26 so that the connectors 23 and 25 mate, the fingertabs 76 snap into the detents 68, thus holding the cartridge in place. No supporting hardware, such as screws, nuts, or bolts, is required to secure the cartridge 12 to the terminal 10, thus providing ease of installation for the user. In addition, the cartridge 12 is held in place within the recess 26 in the rear of the terminal 10 by the interference fit between the detents 68 and the fingertabs 76 rather than by the frictional connection between connectors 23 and 25, thereby relieving undue stress upon the connectors 23 and 25.

Figure 5:
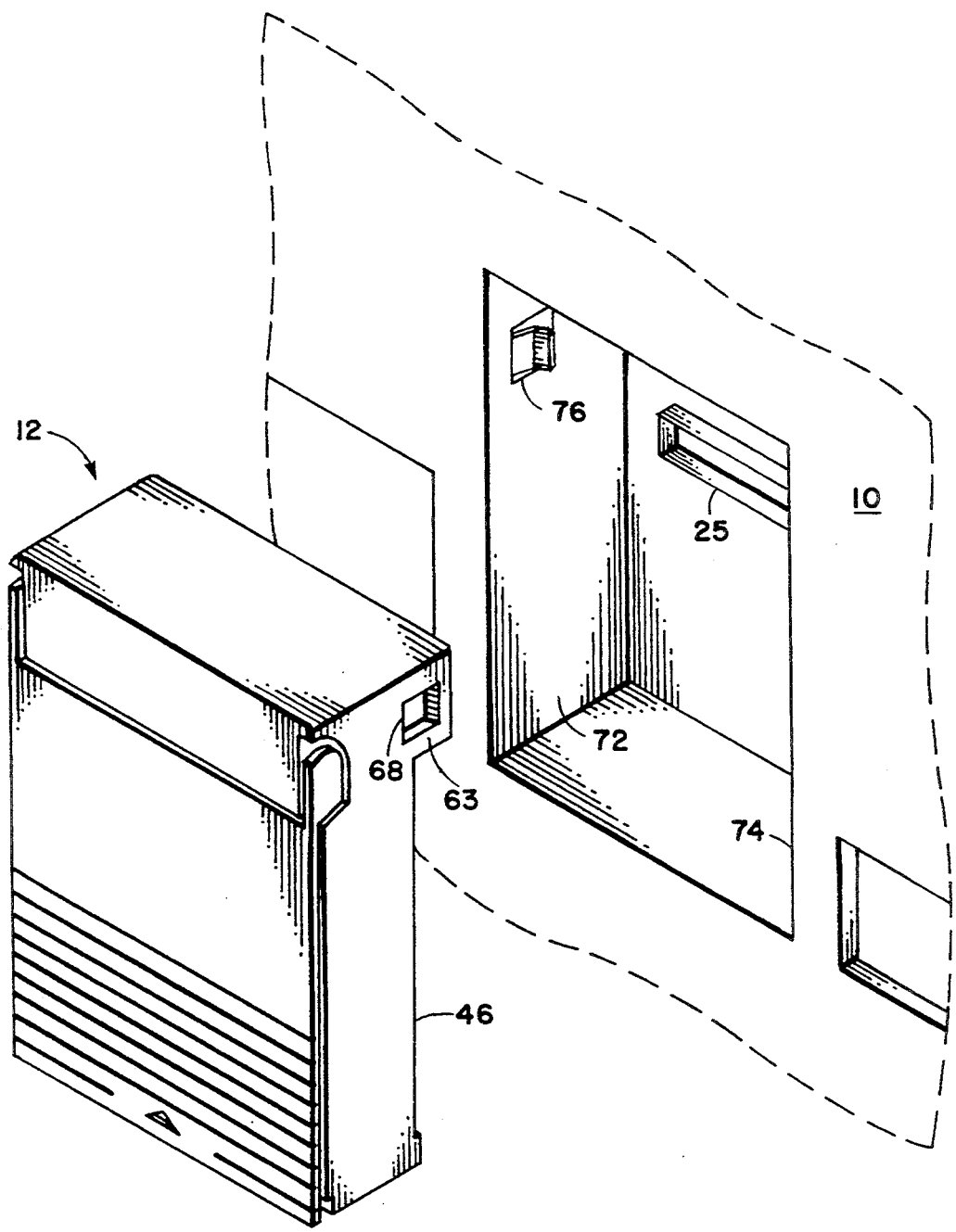
FIG. 5 is a perspective view of the PC board cartridge as it is installed in the terminal.
Figure 6:
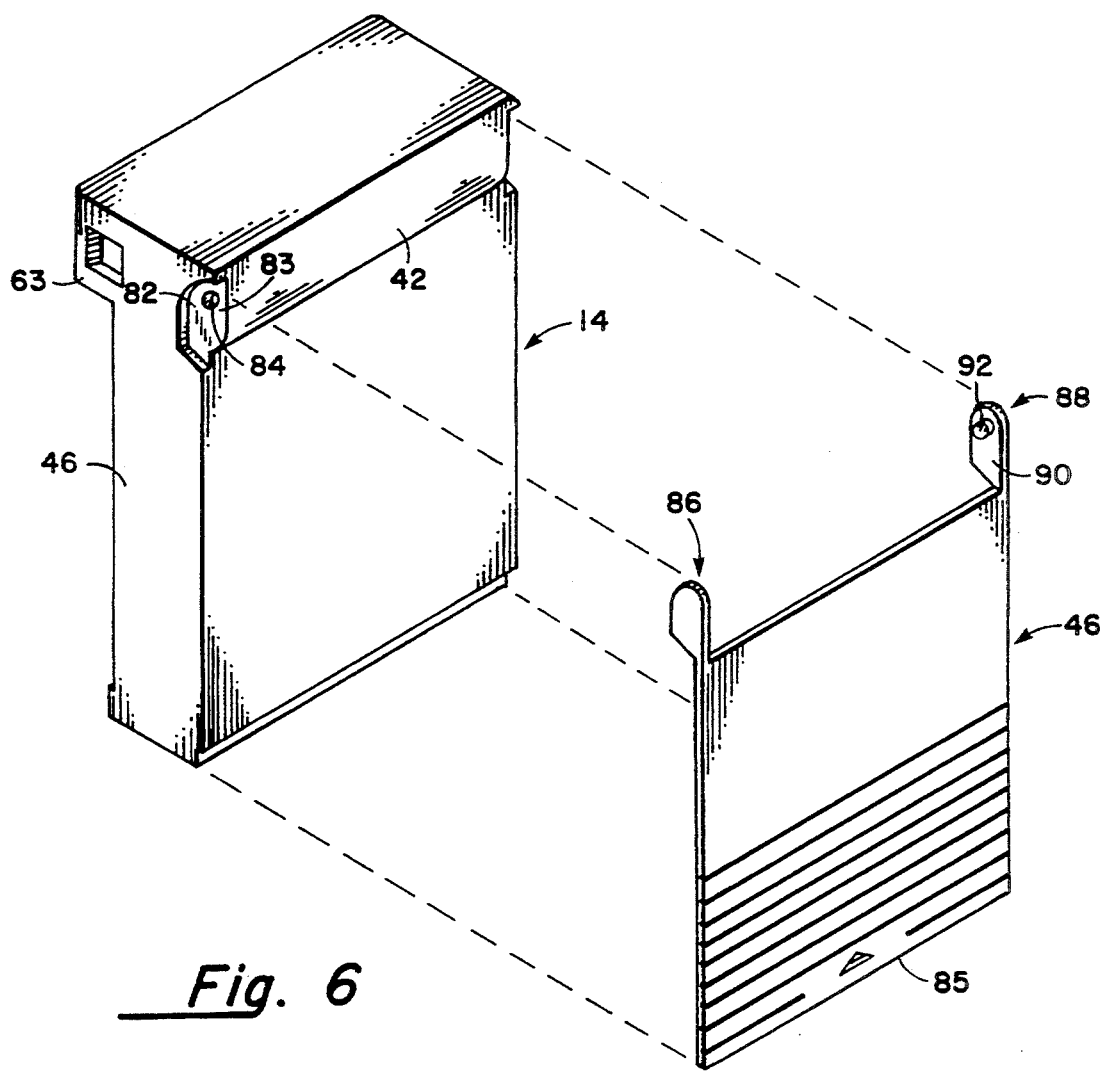
FIG. 6 is a perspective view of a cartridge casing and handle assembly according to the principles of the invention.

Referring now to FIG. 5, there is shown the assembly of the cartridge casing 14 and the handle 16. The casing 14 has on the wider regions 63 of each of its sidewalls 46 near the back wall 42 a cutout 82. On the inner wall 83 of the cutout 82 there is an indentation 84, here shown for example as a circular indentation. The handle 16 includes a wide flat section 85 for grasping, and at one end includes two laterally spaced apart projections 86 and 88. Each of the laterally spaced projections 86 and 88 has on it interior surface 90 a protrusion 92, here shown as a circular rod shaped protrusion, aligned for cooperation with the respective indentations 84 on the wider regions 63 of the sidewalls 46 of the casing 14. The handle 16 is snapped into place on the casing 14 by sliding the projections 86 and 88 onto the sidewalls 46 of until the protrusions 92 engage the indentations 84 thereby holding the handle 16 in place on the casing 14. Again, no supporting hardware is required for assembly of the casing 14 and handle 16.

It is apparent that, within the scope of the invention, modifications and different arrangements may be made other than as herein disclosed. The present disclosure is merely illustrative, the invention comprehending all variations thereof.

What is claimed is:

1. A PC board cartridge for a computer terminal, the cartridge comprising:
   a PC board having two parallel major surfaces and four minor surfaces;
   a connector on one major surface of the PC board;
   a casing enclosing and carrying the PC board and connector, the casing having an opening at the side of the connector to be mated externally of the casing; and a planar handle pivotally mounted on the casing on an axis lying parallel to a major surface of the board and said handle lying in a plane extending perpendicular to a major surface of the board when pivoted to the horizontal position and intersecting the board at the connector.

2. The cartridge of claim 1, wherein the plane intersects the connector.

3. The cartridge of claim 1, wherein the plane bisects the connector.

4. The cartridge of claim 1, wherein the axis is spaced from the side of the PC board opposite the side with the connector.

5. The cartridge of claim 2, wherein the axis intersects the connector.

6. The cartridge of claim 2, wherein the axis bisects the connector.

7. A PC board cartridge for a computer terminal, the cartridge comprising:
   a casing open on one side and comprising:
      a back wall having an inner surface comprising standoffs extending normally from the inner surface, the standoffs having an end region and a base region wider than the end region;
      end walls extending normally from the inner surface of the back wall, one end wall having a greater width than the other end wall, said one end wall having a slot therein;
      two elongated sidewalls extending normally from the inner surface of the back wall, the sidewalls having inner surfaces, one end of each sidewall being of the width of the one end wall, each sidewall having a line of snap tabs on its inner surface along its length;
   a PC board in the casing, the PC board having a connector mounted thereon, the PC board having a tab extending through the slot and holes through which the end regions of the standoffs extend, the board resting on the base regions of the standoffs and being held in place by the snap tabs, the connector being positioned on the board such that it lies between the wider ends of the sidewalls.

8. The cartridge of claim 7 further comprising a handle pivotally mounted on the casing at locations along an axis extending in a plane, the plane extending perpendicular to a major surface of the PC board and intersecting the board at the connector.

9. The cartridge of claim 7, wherein the sidewalls of the cartridge include detents on their taller ends for cooperation with fingertabs on the sidewalls of a recess in the terminal for holding the cartridge in place.

10. The cartridge of claim 8, wherein the sidewalls of the cartridge include indentations on their taller ends near the back wall, and wherein the handle includes projections at one end on either side, the projections including protrusions on their facing surfaces for engaging the indentations in the sidewalls to hold the handle in place.

* * * * *